(12) United States Patent
Huang et al.

(10) Patent No.: US 8,623,726 B2
(45) Date of Patent: Jan. 7, 2014

(54) METHOD FOR FILLING A PHYSICAL ISOLATION TRENCH AND INTEGRATING A VERTICAL CHANNEL ARRAY WITH A PERIPHERY CIRCUIT

(75) Inventors: Yu-Fong Huang, Tainan (TW); Tzung-Ting Han, Yilan (TW)

(73) Assignee: Macronix International Co., Ltd., Hsin-chu (TW)

( * ) Notice: Subject to any disclaimer, the term of this patent is extended or adjusted under 35 U.S.C. 154(b) by 150 days.

(21) Appl. No.: 12/977,910

(22) Filed: Dec. 23, 2010

(65) Prior Publication Data

US 2012/0161222 A1    Jun. 28, 2012

(51) Int. Cl.
*H01L 21/336* (2006.01)

(52) U.S. Cl.
USPC ........... 438/268; 438/257; 438/258; 438/267; 257/324; 257/E21.41; 257/E21.546

(58) Field of Classification Search
USPC ............ 257/324, 314, 316, E21.41, E29.242, 257/E21.546; 438/268, 257, 258, 267
See application file for complete search history.

(56) References Cited

U.S. PATENT DOCUMENTS

| | | | |
|---|---|---|---|
| 6,885,060 B2 * | 4/2005 | Nomoto et al. | 257/324 |
| 2007/0264775 A1 * | 11/2007 | Kim et al. | 438/257 |
| 2008/0003742 A1 * | 1/2008 | Cho et al. | 438/257 |
| 2010/0297826 A1 * | 11/2010 | Yun | 438/424 |

* cited by examiner

*Primary Examiner* — Thinh T Nguyen
(74) *Attorney, Agent, or Firm* — Alston & Bird LLP

(57) ABSTRACT

A method of processing a semiconductor structure may include preparing a vertical channel memory structure for filling of a physical isolation trench formed therein. The physical isolation trench may be formed between active structures adjacent to each other and extending in a first direction. The active structures may have channels adjacent to sides of the active structures that are opposite to sides of the active structures that are adjacent to the physical isolation trench. The method may further include filling the physical isolation trench in connection with application of a multi-dielectric layer (ex. an oxide-nitride-oxide (ONO) layer), a polysilicon liner and/or an oxide film. A corresponding apparatus and method for integrating such a structure with a planar periphery are also provided.

15 Claims, 20 Drawing Sheets

METHOD FOR FILLING A PHYSICAL ISOLATION TRENCH AND INTEGRATING A VERTICAL CHANNEL ARRAY WITH A PERIPHERY CIRCUIT

TECHNOLOGICAL FIELD

Embodiments of the present invention generally relate to semiconductor device manufacturing and, more particularly, relate to a method for reducing program disturbance in memory arrays.

BACKGROUND

There is currently an ongoing drive toward the downscaling of device dimensions in virtually all aspects of electronic device manufacturing. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, driving down component size often also means driving down the space between components, which may cause isolation issues.

In memory devices that include an array of tightly-packed memory cells, second bit effect and program disturb are phenomena that may impact the values stored in the memory cells. Improved isolation mechanisms can reduce the impact of these phenomena. However, with ever decreasing component sizes, isolation mechanisms must also continue to evolve.

Due to the high level of integration of devices and the large number of circuits on a single chip, interconnections are often no longer made by means of a single level of interconnections. Instead, at least two and sometimes more conductor interconnection levels may be formed, with each interconnection level having a pattern of wiring trenches being separated from the others by an insulating layer. Trenches may also be used for isolation. However, as even some of the trenches become smaller in size, filling the small spaces may become difficult. It may also be difficult to integrate vertical channel arrays with planar channel periphery circuits.

Accordingly, it may be desirable to provide an improved mechanism for filling small spaces in a semiconductor device such as a memory array. It may also be desirable to develop a mechanism for integrating vertical channel arrays with planar channel periphery circuits.

BRIEF SUMMARY OF EXEMPLARY EMBODIMENTS

A method and apparatus are therefore provided that may provide a relatively-uncomplicated and cost-effective way to fill small spaces in a memory array. More particularly, some example embodiments may be employed to fill a physical isolation trench disposed between active structures of a vertical channel memory array. Some embodiments may also provide for integration of a vertical channel array with a planar channel periphery circuit.

In one exemplary embodiment, a method of processing a semiconductor structure is provided. The method may include preparing a vertical channel memory structure for filling of a physical isolation trench formed therein. The physical isolation trench may be formed between active structures adjacent to each other and extending in a first direction. The active structures may have channels adjacent to sides of the active structures that are opposite to sides of the active structures that are adjacent to the physical isolation trench. The method may further include filling the physical isolation trench in connection with multi-dielectric layer (ex. an oxide-nitride-oxide (ONO) layer), a polysilicon liner and/or an oxide film.

In another exemplary embodiment, a vertical channel memory structure is provided. The vertical channel memory structure may include at least a pair of active structures, channels and a filling material. The active structures may extend along a first direction and may be positioned adjacent to each other while having a physical isolation trench formed therebetween. The physical isolation trench may also extending in the first direction. The channels may be positioned adjacent to sides of the active structures that are opposite to sides of the active structures that are adjacent to the physical isolation trench. The filling material may be disposed in the physical isolation trench in connection with multi-dielectric layer (ex. an oxide-nitride-oxide (ONO) layer), a polysilicon liner and/or an oxide film.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1, which includes FIGS. 1A, 1B, 1C, 1D and 1E, illustrates operations that may be employed to fill a physical isolation trench (PIT), according to an example embodiment;

FIG. 2 illustrates a top view of a vertical channel array to show a potential for word line bridging between adjacent word lines, according to an example embodiment;

FIG. 3, which includes FIGS. 3A, 3B, 3C, 3D and 3E, illustrates operations in a sequence to produce a product that is less susceptible to a PIT-open risk, according to an example embodiment;

FIG. 4, which includes FIGS. 4A, 4B and 4C, shows an example of some of the operations in a sequence to produce a product with low susceptibility to an PIT-open risk, according to an example embodiment;

FIG. 5 illustrates a flow diagram of a method for processing a semiconductor structure according to an example embodiment;

FIG. 6, which includes FIGS. 6A and 6B, illustrates a side view (FIG. 6A) and a top view (FIG. 6B) of the intersection between a vertical channel array portion and a periphery portion of a semiconductor device according to an example embodiment;

FIG. 7 illustrates a side view of the intersection between the vertical channel array portion and the periphery portion of a semiconductor device according to an example embodiment;

FIG. 8, which includes FIGS. 8A (showing a side view) and 8B (showing a top view), illustrates the definition of trenches associated with the PIT and STP at the same time according to an example embodiment;

Figure 11:
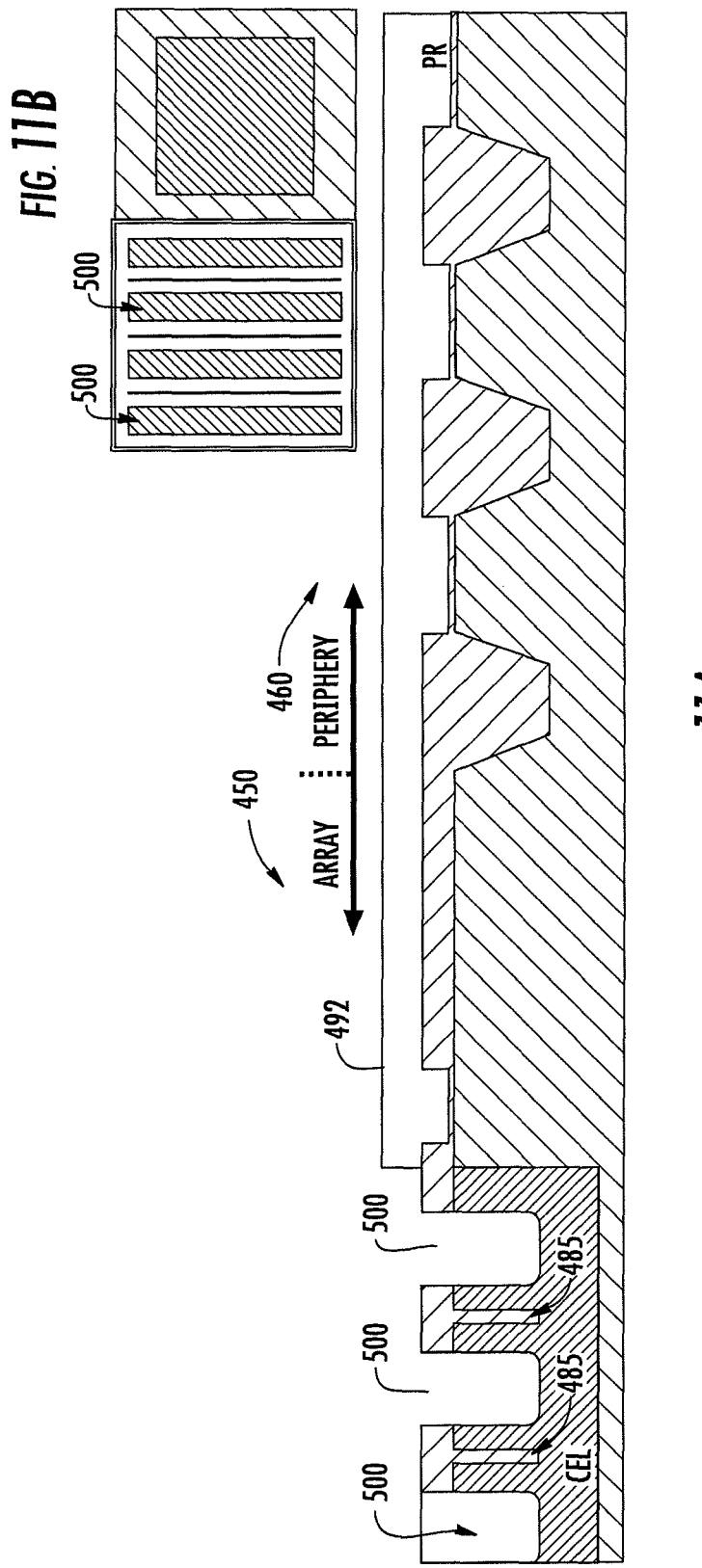
Figure 12:
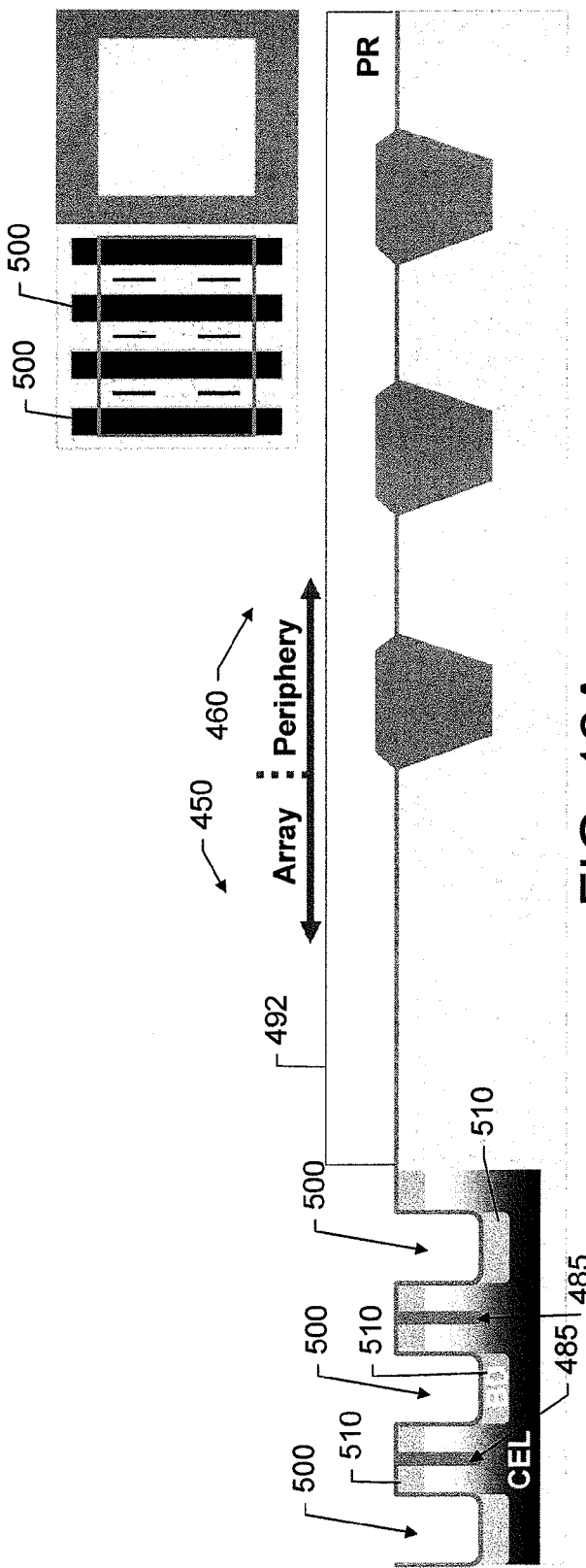
Figure 13:
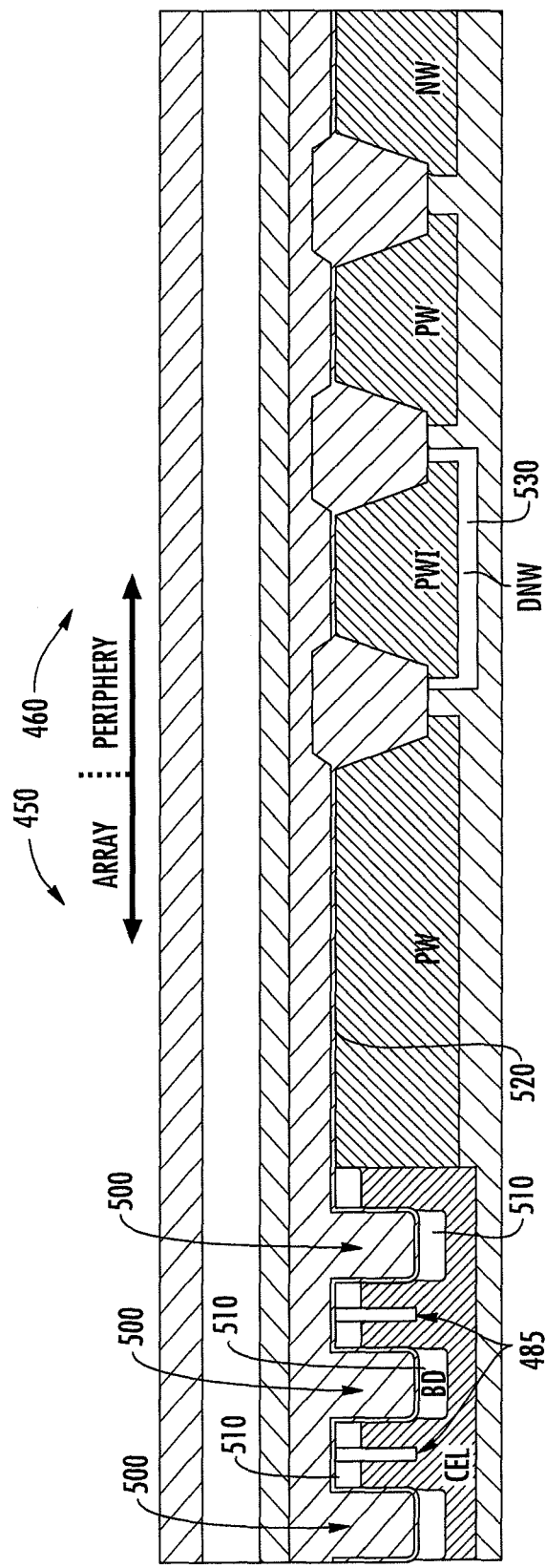
Figure 14:
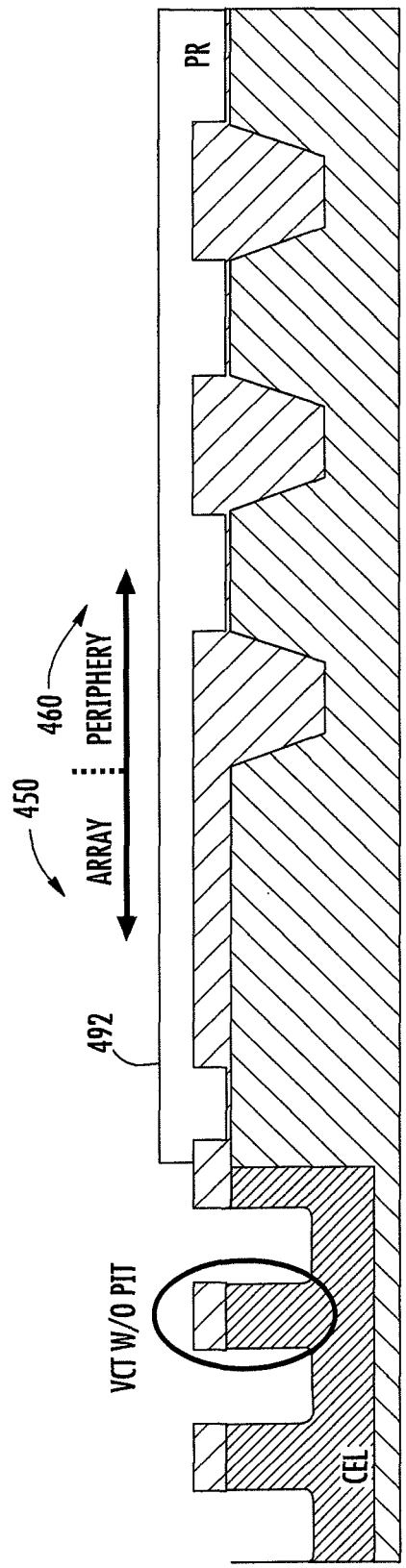
Figure 15:
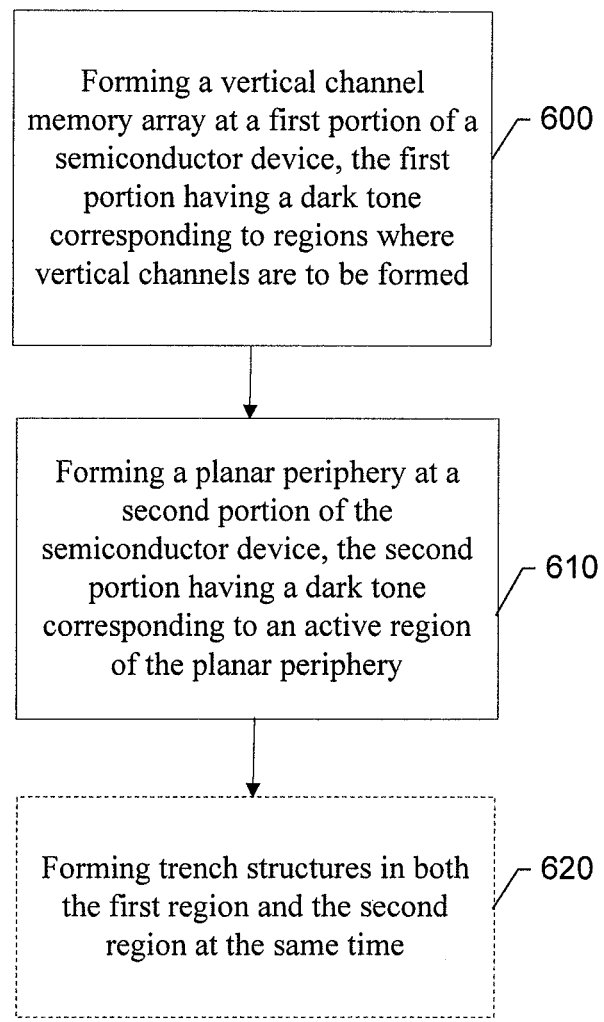

FIG. 11, which includes FIGS. 11A and 11B, illustrates vertical channels being formed according to an example embodiment;

FIG. 12, which includes FIGS. 12A (side view) and 12B (top view) shows sealing of the PIT and buried diffusion operations according to an example embodiment;

FIG. 13 illustrates operations completed immediately prior to word line patterning and metallization according to an example embodiment;

FIG. 14 illustrates a side view of the intersection between the vertical channel array portion and the periphery portion of a semiconductor device without PIT formation according to an example embodiment; and FIG. 15 illustrates a block diagram of a method of integrating a vertical channel array with a planar periphery circuit according to an example embodiment.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

The employment of vertical channel Nbit technology has enabled further component shrinkage. This shrinkage promises to deliver devices capable of storing, for example, four bits per cell, with still further component shrinkage expected in the future. To provide improved protection against program disturbance, physical isolation trench (PIT) technology is proposed for use in connection with a vertical channel structure. The vertical channel structure may employ active-stacked structures aligned in a first direction to form channels. Word lines may extend substantially perpendicular to the channels and have portions that extend into the channels. In some embodiments, storage cells may be formed between the word lines and the active structures. PIT technology may involve the provision of trench isolation within the active-stacked structures. However, filling of the PIT may be difficult due to the relatively small size of the PIT (e.g., <30 nm in some cases). Accordingly, some example embodiments described herein may provide relatively low cost and simple mechanisms by which the PIT may be filled with dielectric or semiconductor material.

FIG. 1, which includes FIGS. 1A, 1B, 1C, 1D and 1E, illustrates several (but not necessarily all) operations that may be employed to fill the PIT according to one example embodiment. As shown, active structures 10 may be formed over a base comprising a substrate over which layers N-type and/or P-type material may be disposed. In an example embodiment, a PIT 20 may be formed between active structures 10 to provide isolation therebetween. The active structures 10 may extend linearly into and out of the page with respect to the view shown in FIG. 1 with linearly-extending channels 22 on either side thereof. The channels 22 may be formed on each of the sides of the active structures 10 that are opposite to the sides of the active structures 10 that are adjacent to the PIT 20.

Figure 1A:
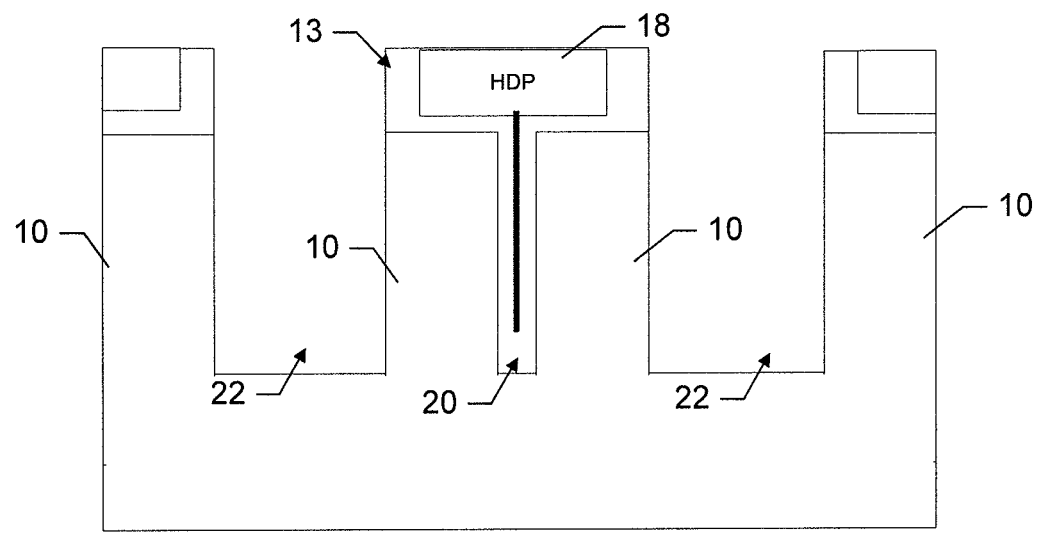
Figure 1B:
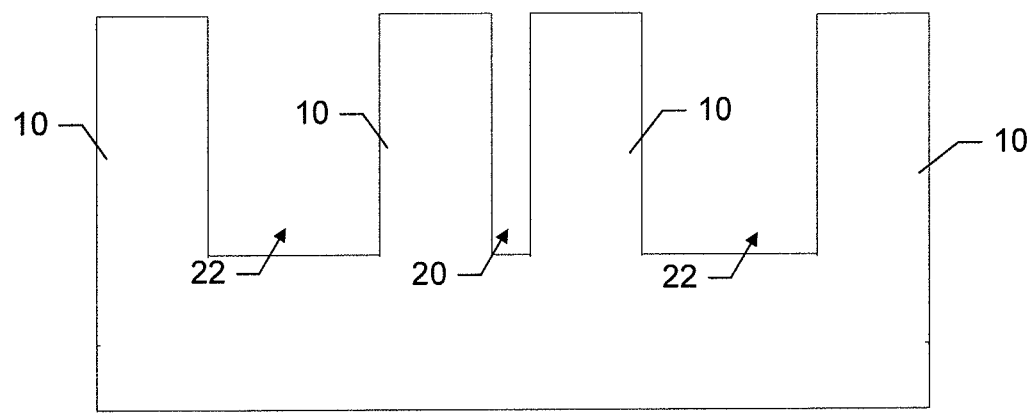
Figure 1C:
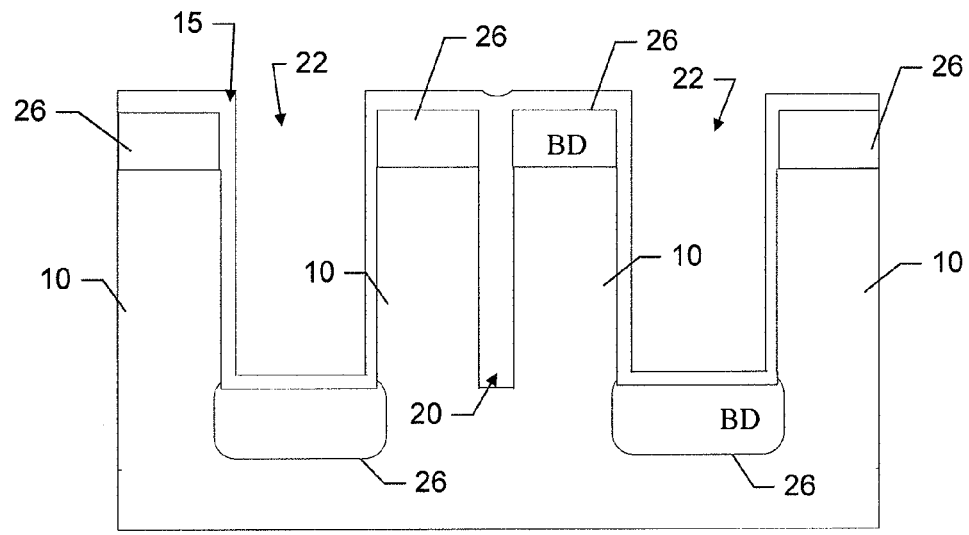
Figure 1D:
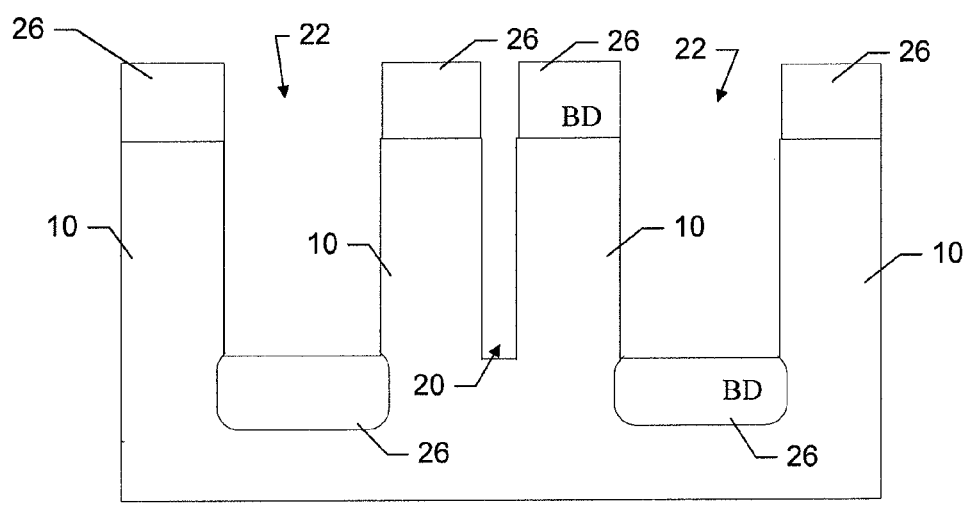
Figure 1E:
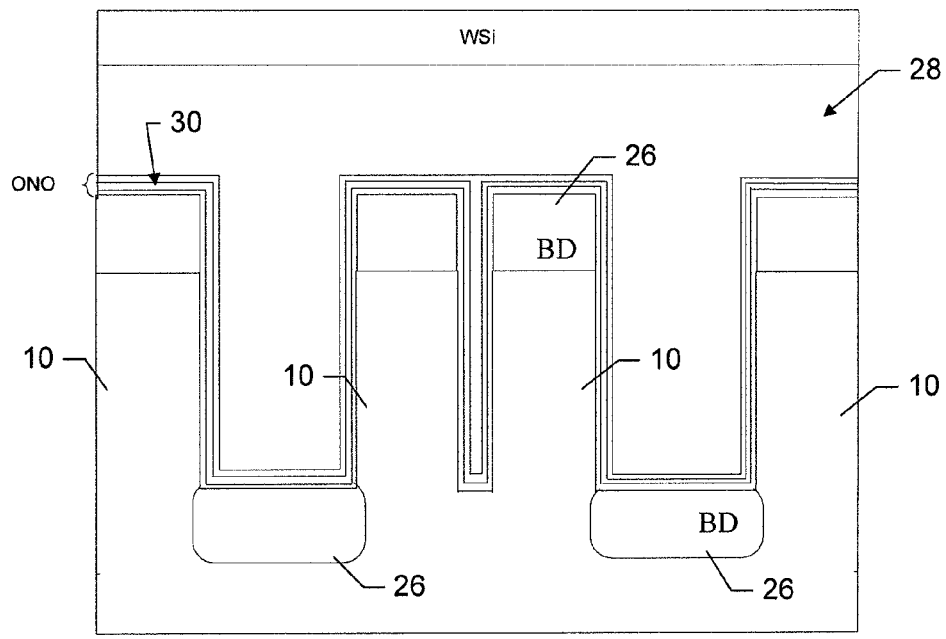

FIG. 1A illustrates a cross-sectional view of the active structures 10 and the PIT 20 responsive to an etching process used to form a vertical channel array. As shown in FIG. 1A, a layer of oxide 13 may initially be positioned on the active structures 10 and the PIT 20, and a high density plasma (HDP) oxide 18 may be disposed over the PIT 20. A cleaning process may then be used to remove the layer of oxide 13 and HDP oxide 18, leaving the active structures 10 exposed along with the PIT 20 and the channels 22, as shown in FIG. 1B. A process may then be employed in connection with buried diffusion (BD) implantation. In the beginning, an oxide material 15 may fill the PIT 20 and coat exposed portions of the active structures and the base to protect the channels 22 as shown in FIG. 1C. Then, buried diffusion implanted material 26 may be formed at the tops of the active structures and the bottoms of the channels 22, as also shown in FIG. 1C. Thereafter, a clean process may be undertaken to remove the oxide material coating sidewalls of the active structures as shown in FIG. 1D, leaving the buried diffusion implanted material 26 on top of the active structures and at the bottom of the channels 22. FIG. 1E illustrates completion of ONO deposition within the PIT 20 and over the exposed surfaces of the active structures and the buried diffusion implanted material 26; this being followed by the formation of word lines 28 passing over the active structures and also filling in the channels 22. The ONO deposited in a layer of ONO 30 may substantially fill the PIT 20 as shown in FIG. 1E. Of note, the word lines 28 may be longitudinally extending, substantially perpendicular to the longitudinal extension of the channels 22. In some embodiments, the word lines 28 may also be coated (e.g., with Tungsten Silicide (WSi)) via chemical vapor deposition (CVD) or other processes during metallization of the resulting integrated circuit (e.g., when contact pads or other connections are formed for connecting portions of an integrated circuit to perform corresponding functions).

Figure 2:
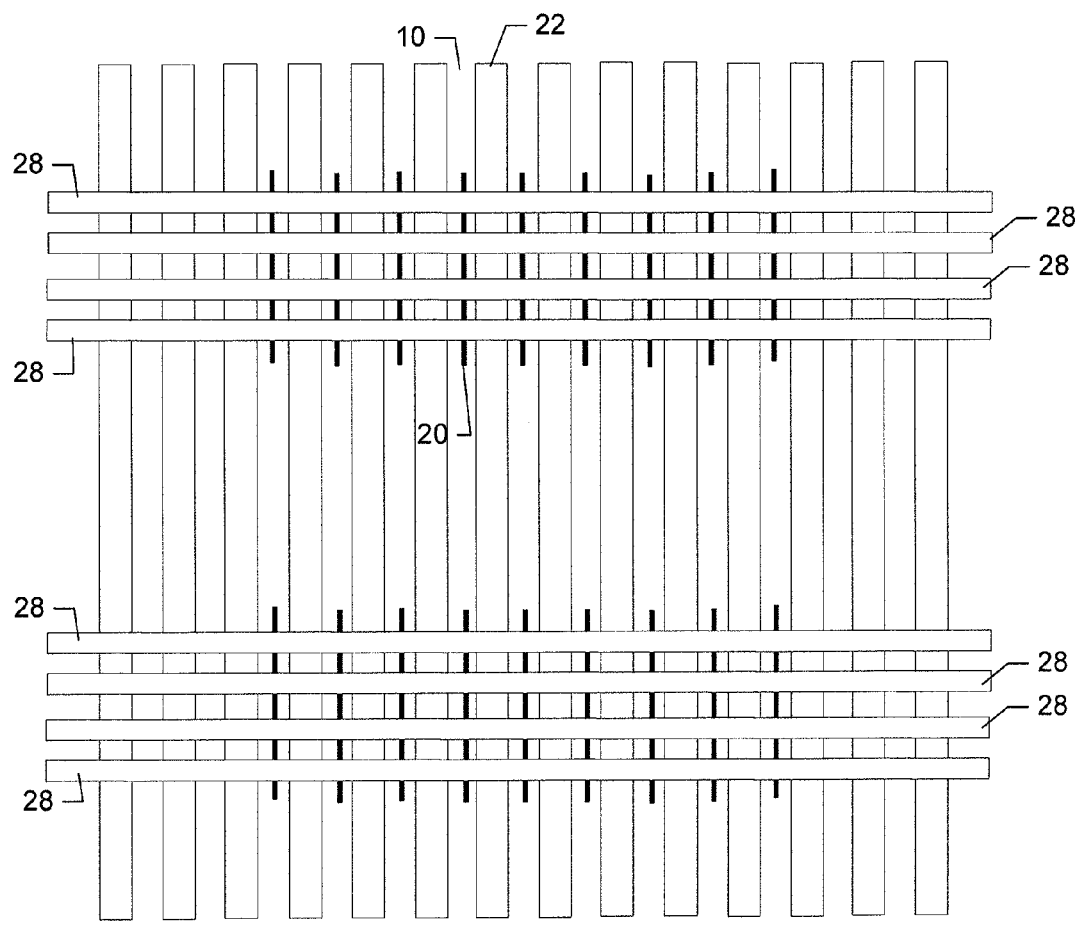

In some cases, if the ONO deposited in FIG. 1E does not merge well in the PIT 20, the PIT 20 may not be fully filled with ONO. If this occurs, there may be a risk of leaving the PIT 20 open to some degree. Thus, for example, polysilicon of the word lines 28 may form inside a portion of the PIT 20 during formation of the word lines 28. This condition could pose a word line bridge risk after word line patterning. In this regard, as shown in FIG. 2, vertical channels 22 are shown extending in a first direction with word lines 28 disposed over the top of the vertical channels 22 and the active structures 10. The PIT 20 is also shown in FIG. 2 and, if a portion of the PIT 20 is not filled, polysilicon may fill such portion to form a bridge between adjacent word lines 28.

Figure 3A:
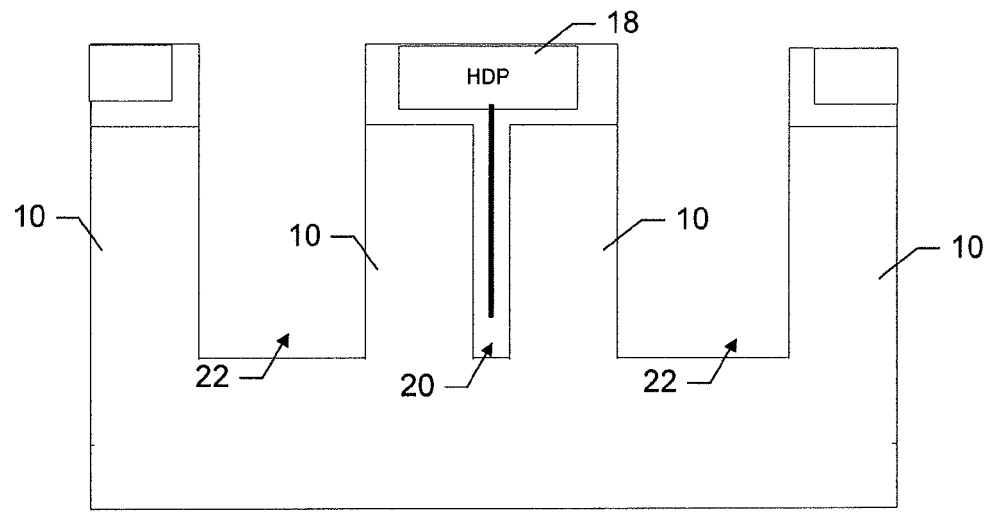
Figure 3B:
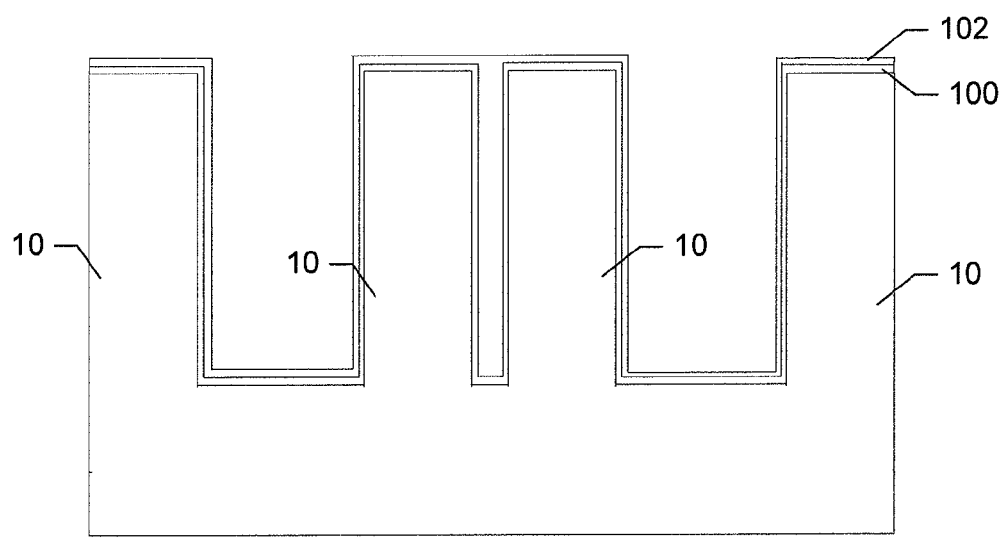
Figure 3C:
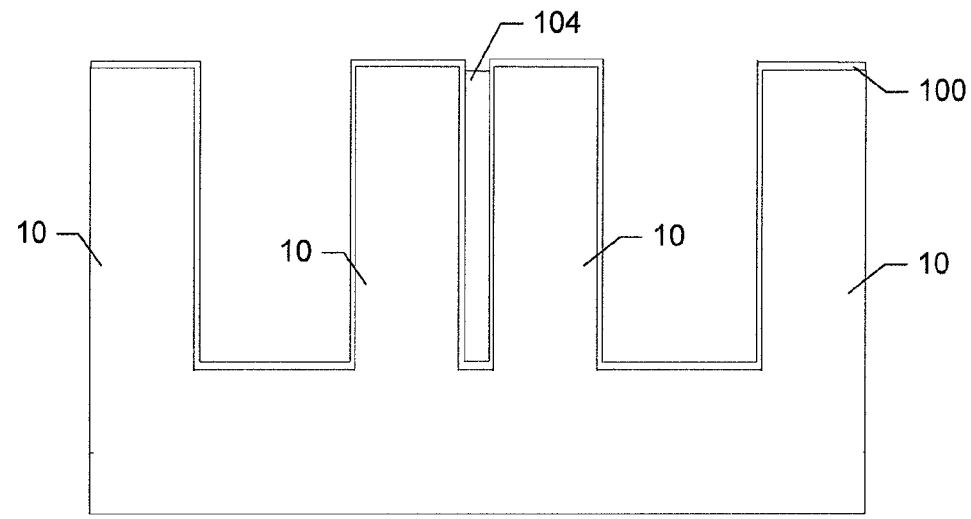

In order to prevent or at least mitigate the risk of word line bridge formation, some embodiments may include either a polysilicon liner and/or oxide film in the PIT 20 to help fill the PIT 20 and reduce the PIT-open risk. FIG. 3, which includes FIGS. 3A to 3E, illustrates several (but not necessarily all) of the operations in a sequence to produce a product that is less susceptible to the PIT-open risk. FIG. 3A shows a cross-sectional view of the active structures 10 and the PIT 20 responsive to an etching process used to form a vertical channel array similar to the product of FIG. 1A. As shown in FIG. 3B, a thin oxide layer 100 may be formed over exposed surfaces of the active structures 10, the channels 22 and also within the PIT 20. A polysilicon layer 102 may then be formed over the oxide layer 100 including entirely filling the PIT 20. FIG. 3C then shows the results of a chemical dry etching etch back process that may be employed to remove exposed portions of the polysilicon layer (i.e., portions of the polysilicon layer 102 that are substantially outside of the PIT 20) to leave only a polysilicon liner 104 within the PIT 20. As can be seen from FIG. 3C, in some cases, the polysilicon liner 104 may not fully fill the PIT 20. However, it may not be necessary for the polysilicon liner 104 to fully fill the PIT 20 in some cases.

Figure 3D:
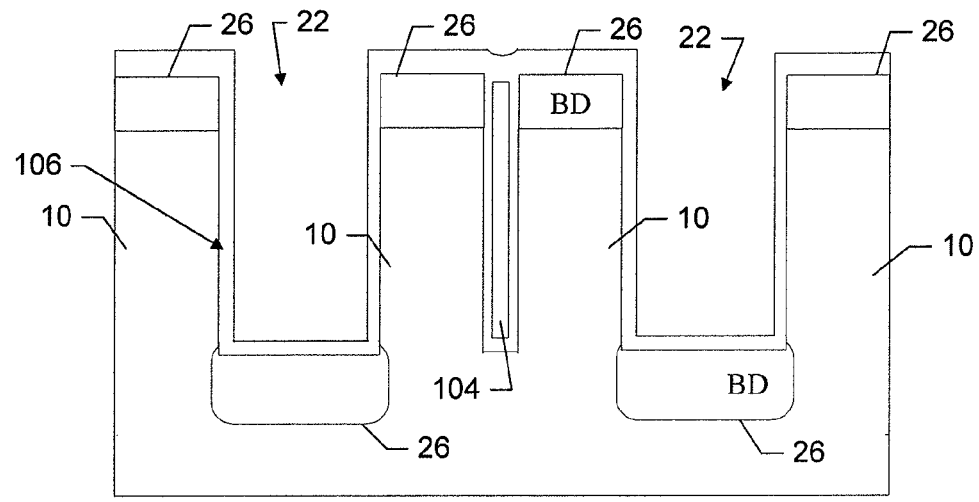
Figure 3E:
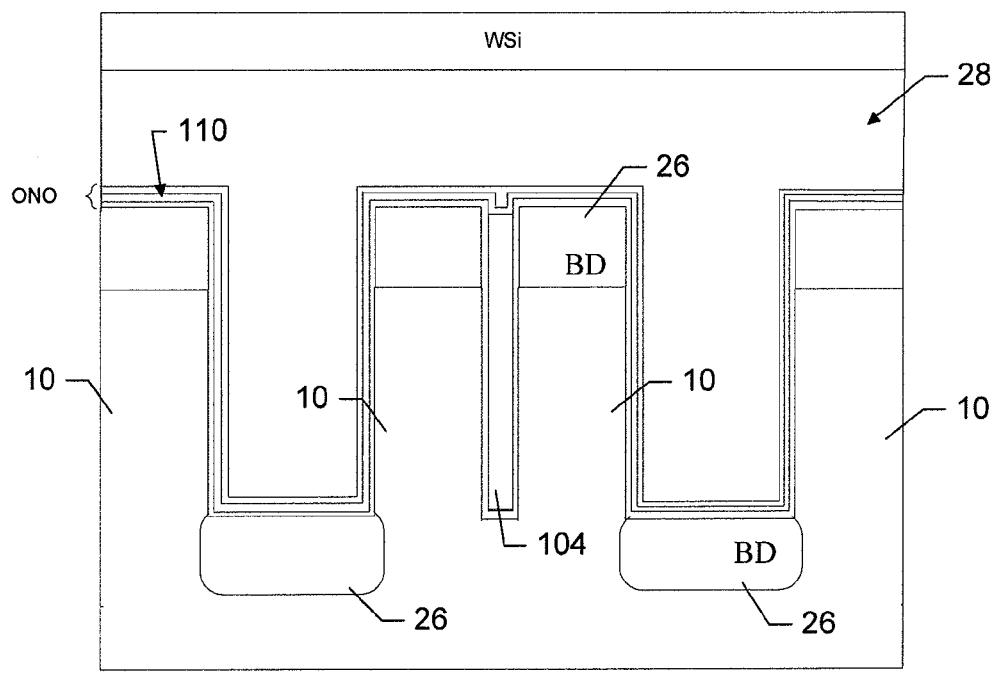

After a process is employed in connection with buried diffusion (BD) implantation, buried diffusion implanted material 26 may be disposed on top of the active structures 10 and at the bottom of the channels 22 with the PIT 20 still filled by the polysilicon liner 104, and a oxide layer 106 coating all exposed surfaces, as shown in FIG. 3D. An ONO layer 110 may be deposited over exposed surfaces thereafter to cover over the PL liner 104 in the PIT 20. As such, when the word lines 28 are formed to run substantially perpendicular to the channels 22, the PIT 20 may be substantially fully filled with no PIT-open issues and thus, the chances of word line bridging may be reduced. Metallization may then occur without concern over word line bridging as shown in FIG. 3E.

Figure 4A:
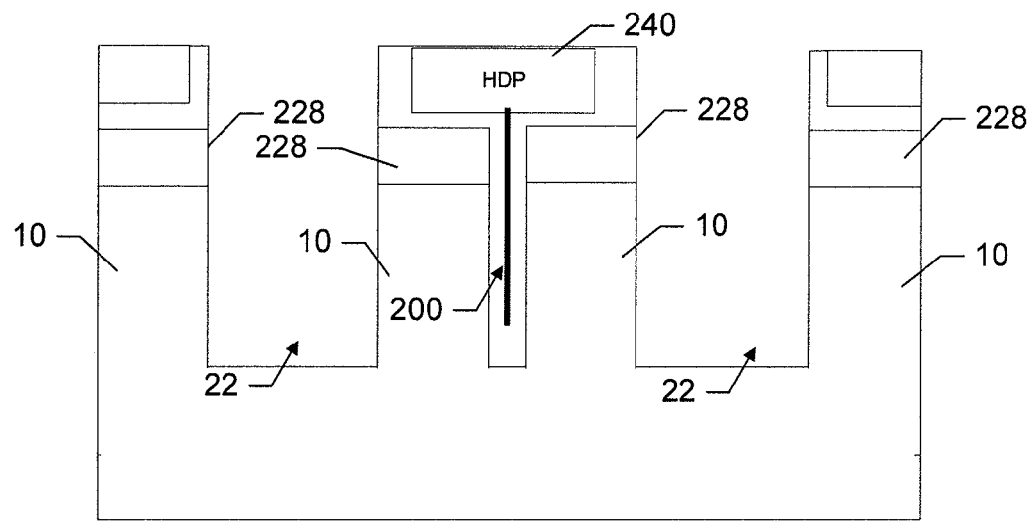
Figure 4B:
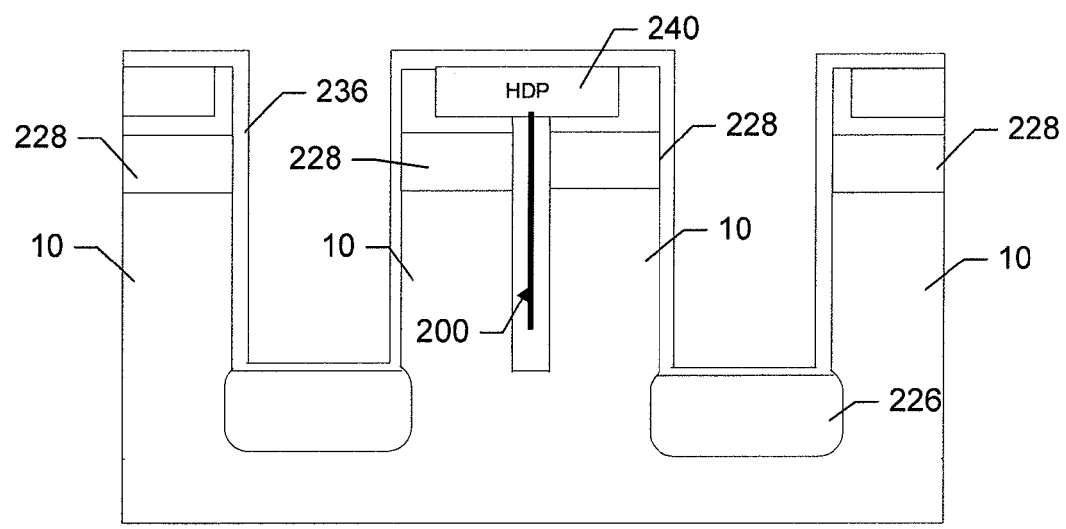
Figure 4C:
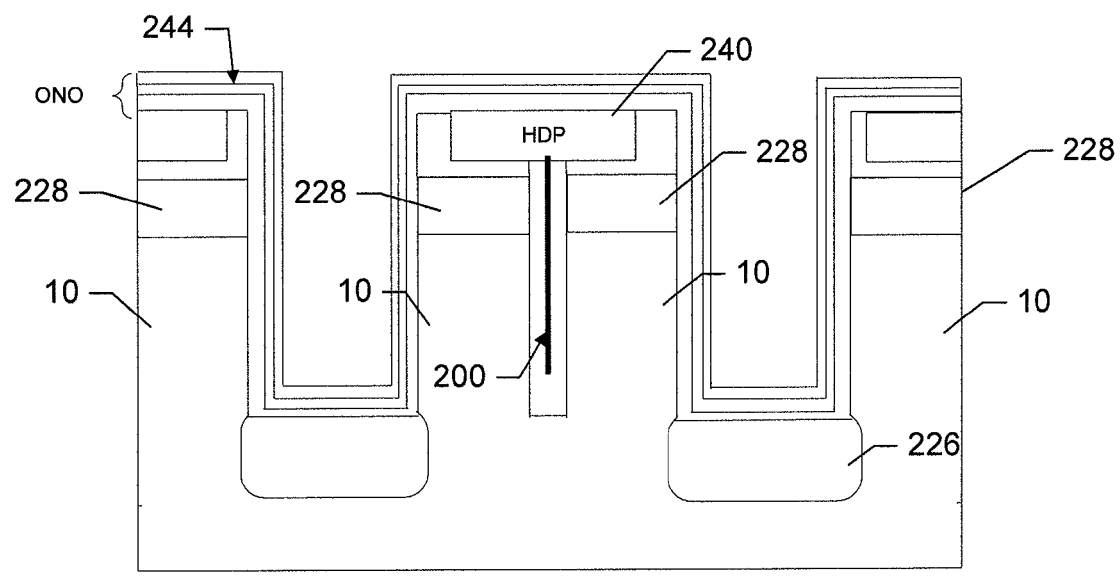

The use of the polysilicon liner 104 is just one example of a mechanism by which to reduce the likelihood of word line bridging. In some embodiments (such as the example of FIG. 4), rather than using the polysilicon liner 104, an oxide film 200 may be used to substantially fill the PIT 20. For example, the oxide film 200 initially filling the PIT 20 may be retained as the HDP oxide 240 used to cap the open region of the PIT 20 to prevent word line bridging by reducing or eliminating the PIT-open risk. FIG. 4, which includes FIGS. 4A, 4B and 4C, shows several (but not necessarily all) of the operations in a sequence to produce a product that is less susceptible to the PIT-open risk. FIG. 4A shows a cross-sectional view of the active structures 10 and the PIT 20 responsive to an etching process used to form a vertical channel array similar to the products of FIG. 1A and FIG. 3A. Here, top buried diffusion implanted material (TBD) 228 is formed before vertical channel process. As shown in FIG. 4B, a process may be employed in connection with buried diffusion (BD) implantation, such that bottom buried diffusion implanted material (BBD) 226 may be disposed at the bottom of the channels 22. The oxide layer 236 may coat the exposed surfaces as shown in FIG. 4B including the filled PIT 20 (filled with oxide material 200 and capped with HDP 240. Thereafter, as shown in FIG. 4C, an ONO layer 244 may be deposited over exposed surfaces to cover over the HPD 240 (e.g., after a clean process that is not shown in FIG. 4). The ONO layer 244 may have the word lines formed thereon that run substantially perpendicular to the channels 24, with the PIT 20 still substantially filled to prevent PIT-open issues. Accordingly, the chances of word line bridging may be reduced. Metallization may then occur without concern over word line bridging.

Example embodiments described herein, along with other examples that follow therefrom, may enable memory fabricators to fill-in small areas to effectively fill such areas in a relatively cheap and reliable manner. Small spaces, like the PIT formed within active structures of a vertical channel memory array, may be filled with ONO deposition, a polysilicon liner and/or an oxide film. In the context of example embodiments, ONO deposition may include the use of materials such as oxide-nitride-oxide, bandgap engineered silicon-oxide-nitride-oxide-silicon (BE-SONOS), nanocrystal and/or other possible storage mediums. Meanwhile, the polysilicon liner may utilize materials such as, for example, amorphous silicon (a-Si), polycrystalline silicon (P-Si) and/or single crystal silicon (c-Si). The oxide film may be a material such as, for example, HTO (high temperature oxidation), tetrethoxysilicide (TEOS), in situ steam generation (ISSG) and/or other oxide films with good step coverage.

Some embodiments of the present invention may provide a mechanism by which improvements may be experienced in relation to resisting program disturbance in a memory array such as a multi-level cell (MLC). In this regard, some embodiments may provide improved isolation between active structures proximate to which charge storage (and therefore memory functions) may be accomplished.

Figure 5:
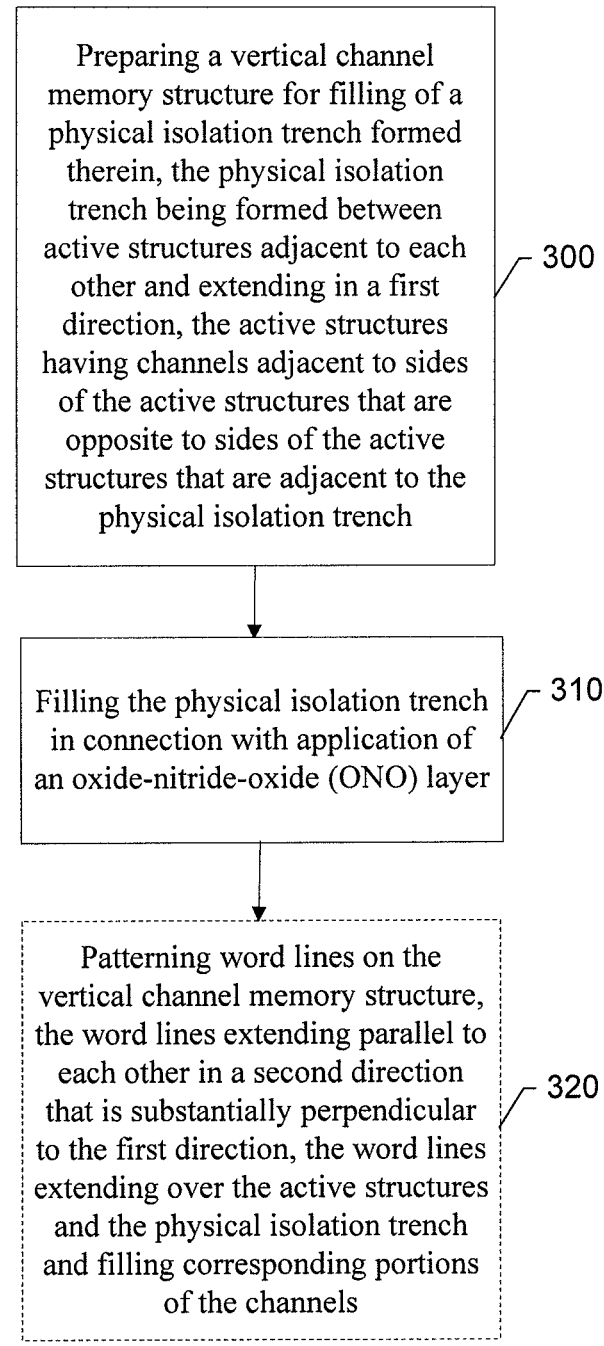

FIG. 5 illustrates a flow diagram of a method for processing a semiconductor structure according to an example embodiment. The method may include preparing a vertical channel memory structure for filling of a physical isolation trench formed therein. The physical isolation trench may be formed between active structures adjacent to each other and extending in a first direction. The active structures may have channels adjacent to sides of the active structures that are opposite to sides of the active structures that are adjacent to the physical isolation trench. The method may further include filling the physical isolation trench in connection with application of an oxide-nitride-oxide (ONO) layer.

In some embodiments, certain ones of the operations above may be modified or further amplified as described below. Moreover, in some embodiments additional optional operations may also be included (an example of which is shown in dashed lines in FIG. 5). It should be appreciated that each of the modifications, optional additions or amplifications below may be included with the operations above either alone or in combination with any others among the features described herein in any order. In this regard, for example, the method may further include patterning word lines on the vertical channel memory structure. The word lines may extend parallel to each other in a second direction that is substantially perpendicular to the first direction. The word lines may extend over the active structures and the physical isolation trench and filling corresponding portions of the channels.

In some embodiments, patterning the word lines is performed after filling the physical isolation trench to prevent word line bridging due to a physical isolation trench-open condition. In an example embodiment, filling the physical isolation trench may include filling the physical isolation trench with ONO during application of the ONO layer. In such an example, filling the physical isolation trench with ONO during application of the ONO layer may include performing a cleaning process prior to applying re-oxidation and employing buried diffusion implantation to top portions of the active structures and bottom portions of the channels. Thereafter, an ONO cleaning process may be performed prior to application of the ONO layer. In some cases, filling the physical isolation trench with ONO during application of the ONO layer may include filling the physical isolation trench with ONO, bandgap engineered silicon-oxide-nitride-oxide-silicon (BE-SONOS) or nanocrystal.

In some embodiments, filling the physical isolation trench may include filling the physical isolation trench with an oxide film. In such an example, filling the physical isolation trench with the oxide film comprises filling the physical isolation trench with HTO (high temperature oxidation), tetrethoxysilicide (TEOS), or in situ steam generation (ISSG). In some cases, filling the physical isolation trench with the oxide film may include providing the oxide film in the physical isolation trench having high density plasma (HDP) deposited over a top of the active structures and the oxide film in the physical isolation trench.

In some embodiments, filling the physical isolation trench may include filling the physical isolation trench with a polysilicon liner. In such an example, filling the physical isolation trench with the polysilicon liner may include filling the physical isolation trench with amorphous silicon (a-Si), polycrystalline silicon (P-Si), and single crystal silicon (c-Si). In an example embodiment, filling the physical isolation trench with the polysilicon liner may include providing an oxide film layer over the active structures and the channels, and then applying a polysilicon layer over the oxide film layer and filling the physical isolation trench, and performing a chemical dry etch process to etch back the polysilicon layer on substantially all portions of the vertical channel memory structure except portions within the physical isolation trench. In some embodiments, filling the physical isolation trench with the polysilicon liner may further include performing a cleaning process prior to applying re-oxidation, employing buried diffusion implantation to top portions of the active structures and bottom portions of the channels, and thereafter performing a ONO cleaning process prior to application of the ONO layer.

As indicated above, it may be desirable in some cases to integrate vertical channel arrays with a planar channel periphery. In an example embodiment, a vertical channel array portion may be processed with chemical-mechanical planarization (CMP) and silicon nitride removal to achieve reverse tone for vertical channel definition. Accordingly, dark tone at the array becomes vertical channel. For a planar channel MOS device, current planar processes may be utilized so that the dark tone at the periphery becomes an active region.

Figure 6:
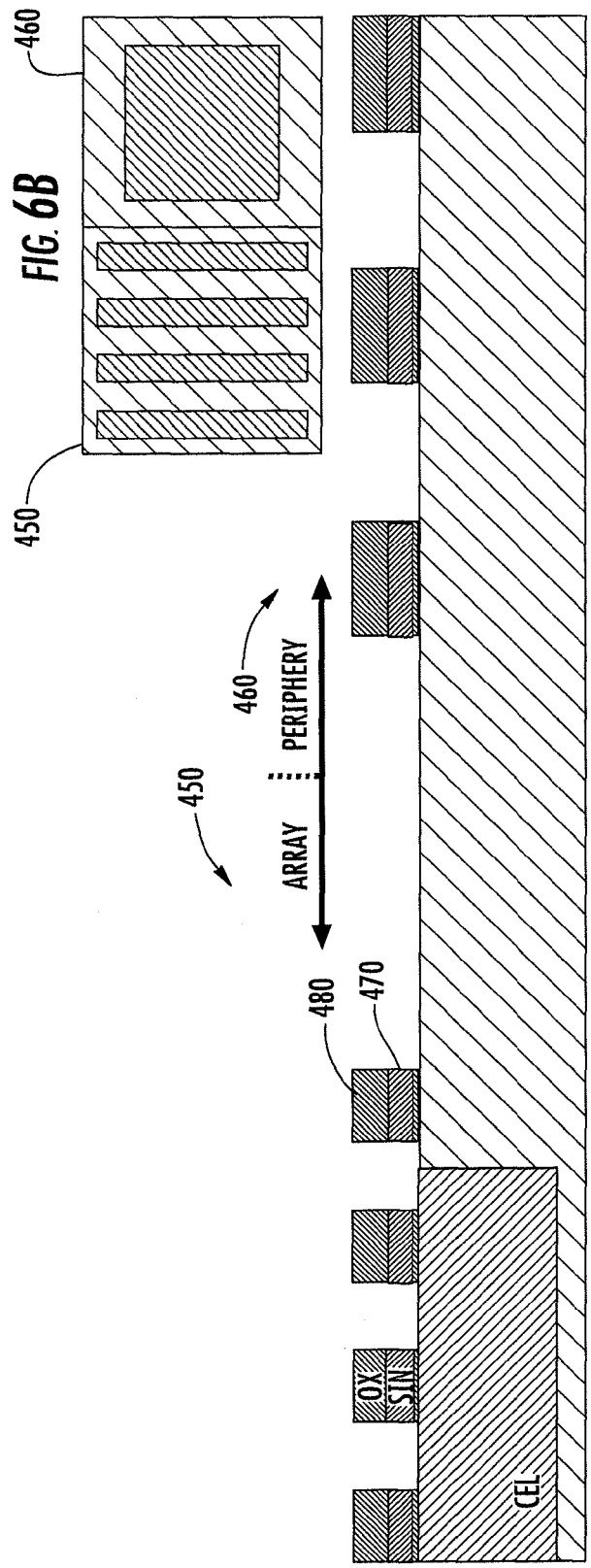

FIG. 6, which includes FIGS. 6A and 6B, illustrates a side view (FIG. 6A) and a top view (FIG. 6B) of the intersection between a vertical channel array portion 450 and a periphery portion 460 of a semiconductor device. In the vertical channel array portion 450, photolithography and implantation operations may be performed to provide Vt control and suppression of hot electron generation and punch. Thereafter, silicon nitride deposits and oxide deposits are provided. The hard mask 480 is performed to prevent silicone nitride 470 damage during following spacer etching process.

Figure 7:
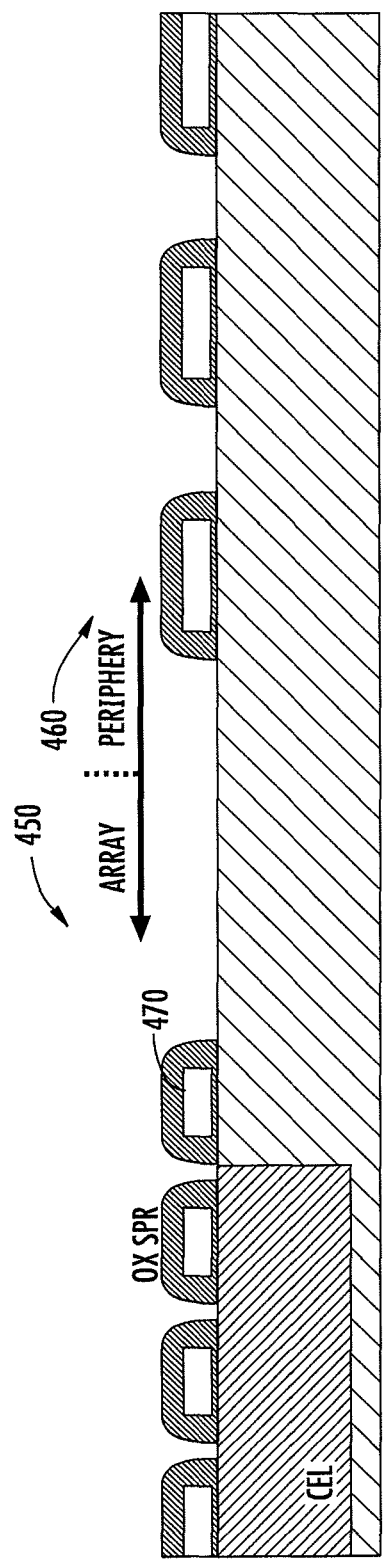
Figure 8:
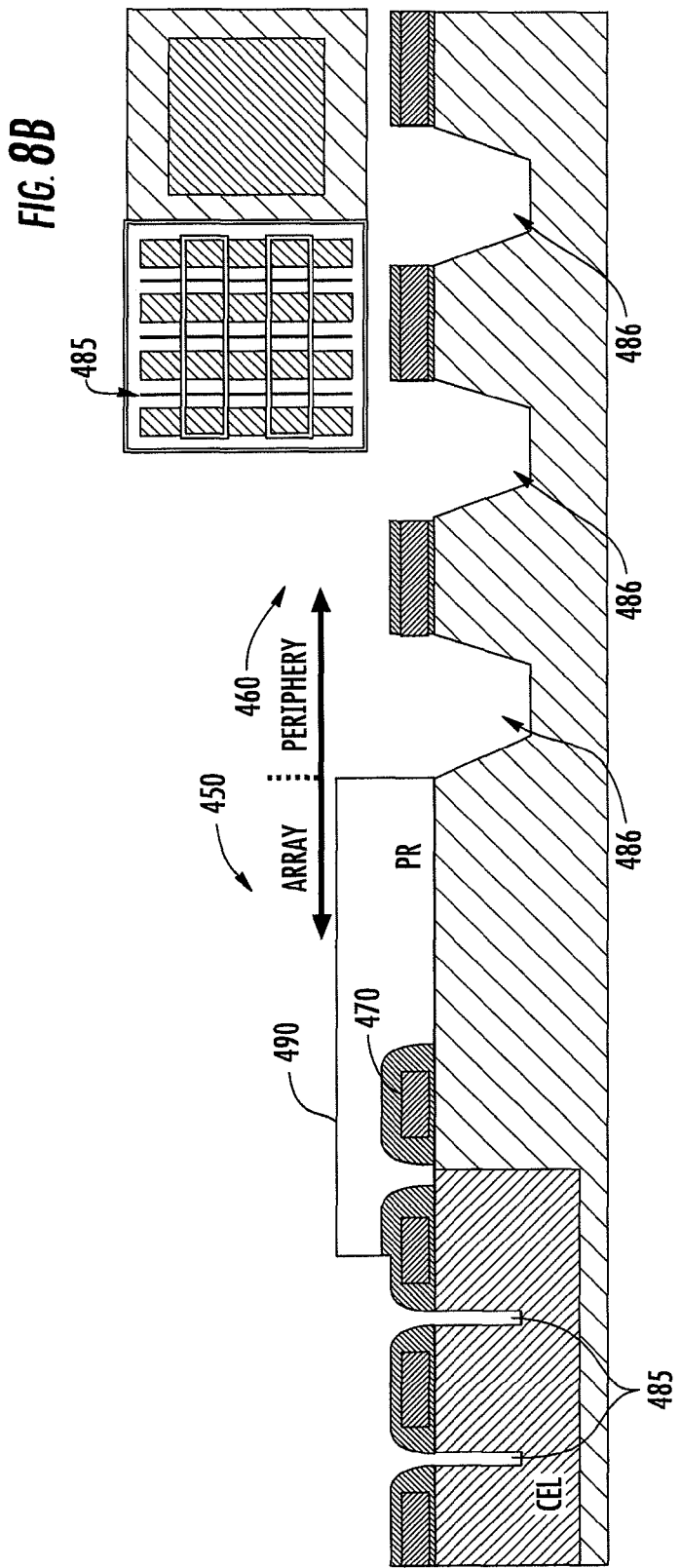

FIG. 7 illustrates a side view of the intersection between the vertical channel array portion 450 and the periphery portion 460 of a semiconductor device to open the space of the oxide spacer to facilitate defining the PIT. FIG. 8, which includes FIGS. 8A (showing a side view) and 8B (showing a top view), illustrates the definition of trenches associated with the PIT and periphery trench at the same time. Thus, some embodiments provide for the formation of trench structures (e.g., PIT 485 and periphery trench 486) in both the vertical channel array portion 450 and the periphery portion 460 at the same time. As shown in FIG. 8A, the PIT 485 is formed in the vertical channel array portion 450 between dark tone regions where a photoresist 490 was placed over a portion of the array that abuts the periphery portion 460.

Figure 9:
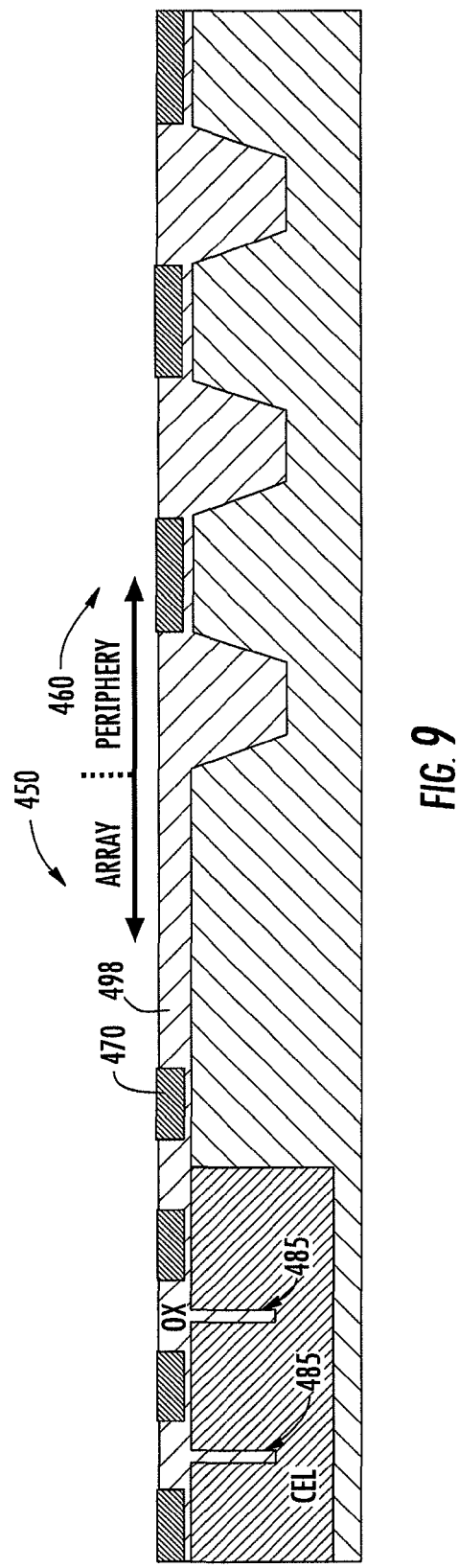
FIG. 9 illustrates filling of the trenches associated with the PIT and periphery trench with oxide material according to an example embodiment.
Figure 10:
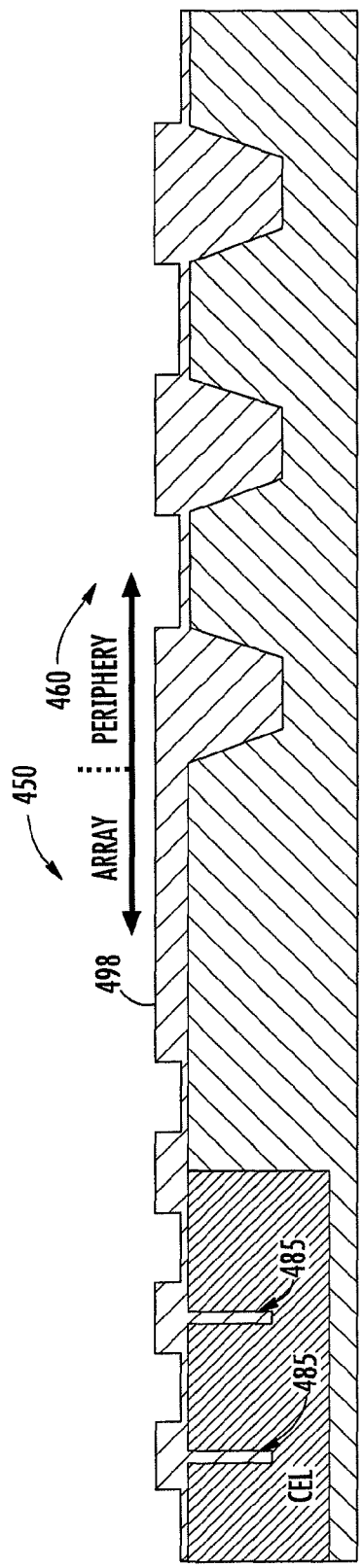
FIG. 10 illustrates removal of silicon nitride according to an example embodiment.

As shown in FIG. 9, an single or multi oxide material 498 may be used to fill up any STI and/or PIT trenches in the vertical channel array portion 450 and the periphery portion 460 at the same time. An STI CMP process may be performed, but stopped when the nitride deposits 470 are reached to exposed. As shown in FIG. 10, removing the nitride deposits 470 then. As shown at FIG. 11, which includes FIGS. 11A and 11B, vertical channels 500 may be formed with a photoresist 492 employed over the periphery portion 460 and over parts of the vertical channel array portion 450 that are adjacent to the periphery portion 460.

Vertical channel cleaning and re-oxidation operations may then be performed to protect the sidewalls of the vertical channels 500 and to seal the PIT 485 (e.g., as described above in reference to FIGS. 1-5). As shown in FIG. 12, which includes FIGS. 12A (side view) and 12B (top view), photolithography and implantation operations may then be provided to define buried diffusion 510. Thereafter, as shown at FIG. 13 (and described with regard to the vertical channel array portion 450 above in FIGS. 1-5), ONO deposition processes may be performed to provide ONO 520 over the vertical channel array portion 450. Post ONO ETCH at periphery region 460, several photo-lithography and implantation operations may be performed to define the well and control the Vt of MOS. In some embodiments, gate oxide, polysilicon and WSi deposition operations may be performed, after which time word line patterning and metallization may be performed.

The embodiments described above are not limiting, but merely illustrate some examples of specific processes that may be practiced in accordance with some embodiments. Thus, some additional operations could also be performed in some example embodiments. Moreover, some operations described above may be omitted or modified. For example, in some cases, no PIT may be formed (e.g., by skipping oxide spacer and PIT ETCH processes) as shown in the example of FIG. 14. In some embodiments, both of MOS and poly could be used to resist the flow of electrical current. Resistance may therefore be a generic term for MOS and poly in a circuit device. Additionally, as stated above, the dark tone at the array may be a generic term for the vertical channel and the dark tone at the periphery may be a generic term for an active region.

FIG. 15 illustrates an example method for integration of a vertical channel array and a planar channel periphery circuit. The method may include forming a vertical channel memory array at a first portion of a semiconductor device in which the first portion has a dark tone corresponding to regions where vertical channels are to be formed. The method may further include forming a planar periphery at a second portion of the semiconductor device in which the second portion has a dark tone corresponding to an active region of the planar periphery. In some embodiments, the method may further include forming trench structures in both the first region and the second region at the same time. In an example embodiment, forming the vertical channel memory array and forming the planar periphery may each include providing silicon nitride deposits in the first and second portions such that the trench structures are formed between the silicon nitride deposits. In some cases, forming the vertical channel memory array and forming the planar periphery may each include providing an oxide material to fill the trench structures and removing the silicon nitride between exposed portions of the oxide material. In an example embodiment, forming the vertical channel memory array may include forming vertical channels extending in a first direction substantially parallel to a border defining an intersection of the first portion and the second portion. In some embodiments, forming the vertical channel memory array may include forming word lines extending longitudinally in a second direction substantially perpendicular to the first direction into and over the vertical channels.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of processing a semiconductor structure, the method comprising:
preparing a vertical channel memory structure for filling a physical isolation trench defined therein, the physical isolation trench being defined between active structures adjacent to each other and extending in a first direction, the active structures also defining channels adjacent to sides of the active structures that are opposite to sides of the active structures that are adjacent to the physical isolation trench;

filling the physical isolation trench in connection with application of dielectric materials; and disposing a buried diffusion implant material to a top portion of the active structures and to a bottom portion of the channels.

2. The method of claim 1, further comprising:

patterning word lines on the vertical channel memory structure, the word lines extending parallel to each other in a second direction that is substantially perpendicular to the first direction, the word lines extending over the active structures and the physical isolation trench and filling corresponding portions of the channels.

3. The method of claim 2, wherein patterning the word lines is performed after filling the physical isolation trench to prevent word line bridging due to a physical isolation trench-open condition.

4. The method of claim 1, wherein filling the physical isolation trench in connection with application of dielectric materials comprises filling the physical isolation trench in connection with application of an oxide-nitride-oxide (ONO) layer.

5. The method of claim 4, wherein filling the physical isolation trench comprises filling the physical isolation trench with ONO during application of the ONO layer.

6. The method of claim 5, wherein filling the physical isolation trench with ONO during application of the ONO layer further comprises performing a cleaning process prior to applying re-oxidation and disposing the buried diffusion implant material, and thereafter performing a ONO cleaning process prior to application of the ONO layer.

7. The method of claim 5, wherein filling the physical isolation trench with ONO during application of the ONO layer comprises filling the physical isolation trench with at least one of ONO, bandgap engineered silicon-oxide-nitride-oxide-silicon (BE-SONOS) or nanocrystal.

8. The method of claim 1, wherein filling the physical isolation trench comprises filling the physical isolation trench with an oxide film.

9. The method of claim 8, wherein filling the physical isolation trench with the oxide film comprises filling the physical isolation trench with at least one of HTO (high temperature oxidation), tetrethoxysilicide (TEOS) or in situ steam generation (ISSG).

10. The method of claim 8, wherein filling the physical isolation trench with the oxide film comprises providing the oxide film in the physical isolation trench having high-density plasma (HDP) deposited over a top of the active structures and the oxide film in the physical isolation trench.

11. The method of claim 1, wherein filling the physical isolation trench comprises filling the physical isolation trench with a polysilicon (PL) liner.

12. The method of claim 11, wherein filling the physical isolation trench with the polysilicon liner comprises filling the physical isolation trench with at least one of amorphous silicon (a-Si), polycrystalline silicon (P-Si) or single crystal silicon (c-Si).

13. The method of claim 11, wherein filling the physical isolation trench with the polysilicon liner comprises:

providing an oxide film layer over the active structures and the channels and then applying a polysilicon layer over the oxide film layer and filling the physical isolation trench; and performing a chemical dry etch process to etch back the polysilicon layer on substantially all portions of the vertical channel memory structure except portions within the physical isolation trench.

14. The method of claim 11, wherein filling the physical isolation trench with the polysilicon liner further comprises performing a cleaning process prior to applying re-oxidation and employing buried diffusion implantation to top portions of the active structures and bottom portions of the channels, and thereafter performing a ONO cleaning process prior to application of the ONO layer.

15. The method of claim 1, wherein a depth of the physical isolation trench does not exceed another depth of the channels.

* * * * *